US006289216B1

(12) United States Patent
Koh et al.

(10) Patent No.: US 6,289,216 B1
(45) Date of Patent: Sep. 11, 2001

(54) METHOD AND SYSTEM FOR MEASURING STANDING WAVE RATIO IN A MOBILE COMMUNICATIONS SYSTEM

(75) Inventors: Kwang-Il Koh; Wan-Soo Kim; Jin-Soo Park, all of Seoul (KR)

(73) Assignee: SamSung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/050,888

(22) Filed: Mar. 31, 1998

(30) Foreign Application Priority Data

Mar. 31, 1997 (KR) .................................................. 97-11667

(51) Int. Cl.$^7$ ...................................................... H04B 1/04
(52) U.S. Cl. ..................... 455/424; 455/67.4; 455/226.1; 343/703
(58) Field of Search ................................... 455/423, 424, 455/226.1, 226.2, 115, 67.4, 67.1; 343/703

(56) References Cited

U.S. PATENT DOCUMENTS

| | | |
|---|---|---|
| 4,041,395 * | 8/1977 | Hill .......................................... 324/58 |
| 4,096,441 | 6/1978 | Schwarts . |
| 4,110,685 | 8/1978 | Leenerts . |
| 4,117,493 | 9/1978 | Altmayer . |
| 4,249,127 | 2/1981 | Morgan . |
| 4,262,246 | 4/1981 | Fujii . |
| 4,290,009 | 9/1981 | Sanpei et al. . |
| 4,380,767 | 4/1983 | Goldstein et al. . |
| 4,422,078 | 12/1983 | Cremeen . |
| 4,479,087 | 10/1984 | Althouse . |
| 4,584,650 | 4/1986 | Kozuch . |
| 4,739,515 | 4/1988 | Herzog . |
| 4,860,024 | 8/1989 | Egashira . |
| 5,157,338 * | 10/1992 | Motherbaugh et al. ........... 455/226.1 |
| 5,225,847 * | 7/1993 | Roberts et al. ....................... 455/424 |
| 5,408,690 * | 4/1995 | Ishikawa et al. ..................... 455/115 |
| 5,471,146 * | 11/1995 | Krayeski et al. .................. 455/226.1 |
| 5,502,756 * | 3/1996 | Crocker et al. ......................... 379/29 |
| 5,521,904 * | 5/1996 | Eriksson et al. ..................... 455/67.4 |
| 5,539,803 * | 7/1996 | Bhat et al. ......................... 455/226.2 |
| 5,548,820 * | 8/1996 | Victorin ............................... 455/67.4 |
| 5,570,373 * | 10/1996 | Wing .................................... 455/423 |
| 5,572,510 * | 11/1996 | Koivu .................................. 455/423 |

FOREIGN PATENT DOCUMENTS

| | | |
|---|---|---|
| 1347037A1 | 10/1987 | (SU) . |
| WO 93/01503 | 1/1993 | (WO) . |
| WO 97/26544 | 7/1997 | (WO) . |

* cited by examiner

Primary Examiner—Lee Nguyen
Assistant Examiner—Simon Nguyen
(74) Attorney, Agent, or Firm—Robert E. Bushnell, Esq.

(57) ABSTRACT

A method for measuring a voltage standing wave ratio (VSWR) without another test device for testing a radio unit of a base station in a mobile communications system is disclosed. The method for measuring a standing wave ratio for a transmission antenna in a base station of a mobile communications system, which includes at least one transmission antenna, comprises the steps of: (a) generating a test signal by using a given test terminal included in the base station and transmitting the generated test signal to the transmission antenna; (b) upon the test signal being transmitted to the transmission antenna, measuring the strength of a forward signal and a reflect signal for the transmission antenna; and (c) obtaining the difference between the strength of the forward signal, and the strength of the reflect signal and calculating the standing wave ratio for the transmission antenna by using the difference therebetween. A similar method is employed for measuring the standing wave ratio for a reception antenna. Moreover, in another embodiment, a valuable attenuator is adjusted to make the forward and reflect signals equal, and the adjusted signal is used to calculate the VSWR.

30 Claims, 10 Drawing Sheets

METHOD AND SYSTEM FOR MEASURING STANDING WAVE RATIO IN A MOBILE COMMUNICATIONS SYSTEM

CROSS REFERENCE TO RELATED APPLICATION

This application makes reference to, incorporates the same herein, and claims all benefits accruing under 35 U.S.C. §119 from applications for METHOD FOR MEASURING STANDING WAVE RATIO IN MOBILE COMMUNICATION SYSTEM earlier filed in the Korean Industrial Property Office on Mar. 31, 1997, and there duly assigned Ser. No. 11667/1997.

BACKGROUND OF THE INVENTION

1. Technical Field

The present invention relates to a base station test unit for testing a base station in a mobile communications system and, more particularly, to a method and system for measuring the standing wave ratio for a transmission antenna and a reception antenna so as to test a radio unit of the base station.

2. Related Art

In general, a mobile communications system, such as a code division multiple access (hereinafter referred to as "CDMA") system includes a plurality of base stations, a mobile station, and a BSM (base station manager). The base stations thereof are connected via radio with the mobile station so as to enable each of the base stations to communicate with a PSTN (public switched telephone network). In order that the base stations communicate smoothly with the PSTN, there must be a periodic check and diagnosis as to whether or not there is an abnormal state at the base station or the base station is out of order. To meet this requirement, a base station test unit is required to test the base station and the test unit has the function of monitoring and diagnosing for the existence/nonexistence of the base station and any disorder at the base station.

The base station test unit for testing the base station can be used to perform a number of test functions. In particular, if there is damage to a radio unit of the base station having an external antenna, the test unit is useful in testing whether or not there is damage to the antenna or whether or not there is damage to the radio unit of the base station. A characteristic value which is determinative as to the existence/nonexistence of the radio unit of the base station and as to damage to the base station is the voltage standing wave ratio (hereinafter, referred to as "VSWR"). Therefore, the radio unit of the base station can be tested by measuring the VSWR. For reference, the VSWR has a value indicating the size of the standing wave ratio generated by voltage in the transmission path and the ratio is obtained by dividing a maximum value of the standing wave by a minimum value of the standing wave.

Nevertheless, in prior systems, there is a limit to measurement of the VSWR since, in such systems, hardware for measuring the VSWR and a controller capable of controlling the hardware are separately installed. Therefore, there has been a need for the development of a method and system for measuring VSWR without employing any other device for testing the radio unit of the base station in a mobile communications system.

The following patents are considered to be representative of the prior art related to the invention, but are burdened by the disadvantages discussed herein: U.S. Pat. No. 4,380,767 to Goldstein et al. entitled Controlled Antenna Tuner, U.S. Pat. No. 4,479,087 to Althouse entitled Standing Wave Ration And Power Meter, U.S. Pat. No. 4,584,650 to Kozuch entitled Method and Apparatus for Determining and Directly Measuring the Voltage Standing Wave Ratio of an RF Transmission System, U.S. Pat. No. 4,739,515 to Herzog entitled Voltage Standing Wave Ratio Bridge Measuring Circuit, U.S. Pat. No. 4,860,024 to Egashira entitled Antenna for a Portable Radiotelephone, U.S. Pat. No. 4,290,009 to Sanpei et al. entitled Standing Wave Ratio Detecting Apparatus, U.S. Pat. No. 4,262,246 to Fujii entitled Standing Wave Ratio Detecting Apparatus, U.S. Pat. No. 4,249,127 to Morgan entitled Standing Wave Measuring System, U.S. Pat. No. 4,110,685 to Leenerts entitled Standing Wave Ratio Measurement Instrument, U.S. Pat. No. 4,041,395 to Hill entitled Transmitter Performance Monitor And Antenna Matching System, U.S. Pat. No. 4,117,493 to Altmayer entitled Radio Antenna, U.S. Pat. No. 4,422,078 to Cremeen entitled Full Wave Communication Antenna, U.S. Pat. No. 4,096,441 to Schwartz entitled Test Instrument For Transmitters and U.S. Pat. No. 5,408,690 to Ishikawa et al. entitled Antenna Supervising Apparatus Comprising A Standing Wave Ratio Measuring Unit.

SUMMARY OF THE INVENTION

It is an object of the present invention to provide a method and system for measuring VSWR without employing any other device for testing a radio unit of a base station in a mobile communications system.

It is another object of the present invention to provide a method and system for testing a forward feature and a reflect feature of a first terminal unit of a base station in a mobile communications system, while using a terminal.

It is a further object of the present invention to provide a method and system for measuring the VSWR for a transmission antenna and a reception antenna in a base station of a mobile communication system, while using a terminal.

In order to achieve those and other objects, the present invention generates the given test signal by using a test terminal included in the base station, switches the forward path and the reflect path, respectively, upon passing the generated test signal through an antenna, measures the strength of the forward signal and the strength of the reflect signal, and calculates the VSWRs for the transmission antenna and the reception antenna by using the strength of the measured signals.

According to one aspect of the present invention, the present invention is provided with a method and system for measuring a standing wave ratio for a transmission antenna in a base station of a mobile communications system which includes at least one transmission antenna. The method comprises the steps of: (a) generating a test signal by using a given test terminal included in the base station and by transmitting the generated test signal to the transmission antenna; (b) upon the test signal being transmitted to the transmission antenna, measuring the strength of a forward signal and a reflect signal for the transmission antenna; and (c) obtaining the difference between the strength of the forward signal and the strength of the reflect signal, and calculating the standing wave ratio for the transmission antenna by using the obtained difference therebetween.

Further, according to another aspect of the present invention, the objects of the invention are achieved by a method and system for measuring a standing wave ratio for a transmission antenna in a base station of a mobile communications system which includes at least one transmission antenna and a variable attenuator. The method comprises the steps of: (a) generating a test signal by using a given test terminal included in the base station and by transmitting the generated test signal to the transmission antenna; (b) upon the test signal being transmitted to the transmission antenna, measuring the strength of a forward signal and a reflect signal for the transmission antenna; (c) adjusting the variable attenuator to make the strength of the forward signal equal to the strength of the reflect signal; and (d) calculating the standing wave ratio for the transmission antenna by using the strength of the adjusted signal.

Furthermore, according a further aspect of the present invention, the present invention is provided with a method and system for measuring a standing wave ratio for a reception antenna in a base station of a mobile communications system which includes at least one reception antenna and a transceiver. The method comprises the steps of: (a) generating a test signal by using a given test terminal included in the base station and by transmitting the generated test signal to the reception antenna; (b) upon the test signal being transmitted to the reception antenna, measuring the strength of a forward signal and a reflect signal for the reception antenna; and (c) obtaining the difference between the strength of the forward signal and the strength of the reflect signal, and calculating the standing wave ratio for the reception antenna by using the obtained difference therebetween.

Finally, according to a further aspect of the present invention, the present invention is provided with a method and system for measuring a standing wave ratio for a reception antenna in a base station of a mobile communications system which includes at least one reception antenna, a transceiver and a variable attenuator. The method comprises the steps of: (a) generating a test signal by using a given test terminal included in the base station and by transmitting the generated test signal to the reception antenna; (b) upon the test signal being transmitted to the reception antenna, measuring the strength of a forward signal and a reflect signal for the reception antenna; (c) adjusting the variable attenuator to make the strength of the forward signal equal to the strength of the reflect signal; and (d) calculating the standing wave ratio for the reception antenna by using the strength of the adjusted signal.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE PREFERRED EMBODIMENT(S)

Figure 1:
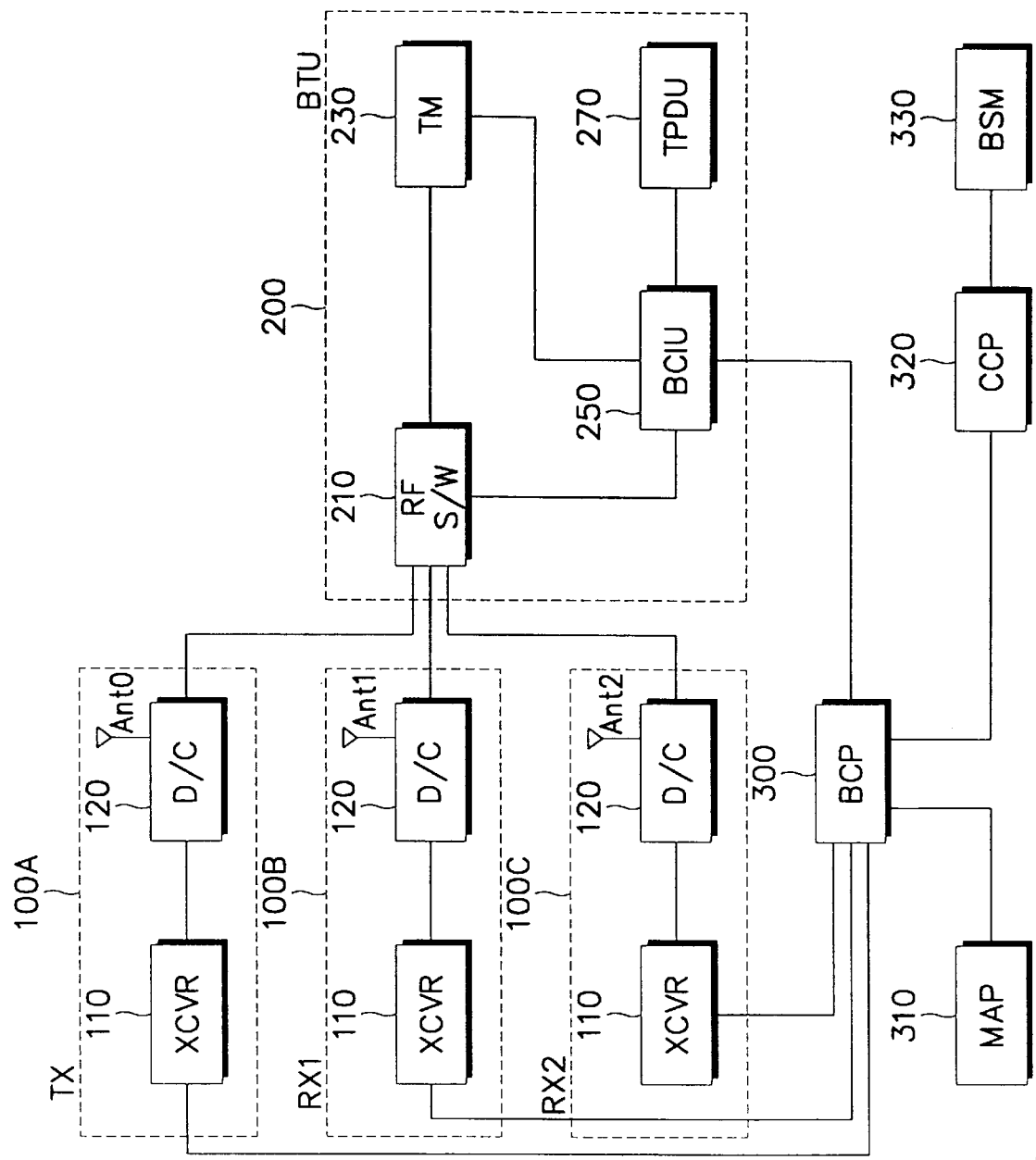
FIGS. 1 and 2 are block diagrams showing the construction of a base station of a CDMA communications system wherein a standing wave ratio is measured according to the present invention.

Hereinafter, a preferred embodiment of the present invention will be concretely explained with reference with accompanying drawings.

Most of all, throughout the drawings, it is noted that the same reference numerals or letters will be used to designate like or equivalent elements having the same function. Further, in the following description, numeral specific details such as concrete components composing the circuit and the frequency, are set forth to provide a more thorough understanding of the present invention. It will be apparent, however, to one skilled in the art that the present invention may be practiced without these specific details. The detailed description of known function and constructions unnecessarily obscuring the subject matter of the present invention has been omitted in the following description. Furthermore, wordings as will be explained hereinafter can be different depending upon the intention or the practice of a chip designer or a user as to what has been defined in consideration of the function of the present invention, and definitions for the above wordings will be made on the basis of the content throughout the specification.

Figure 2:
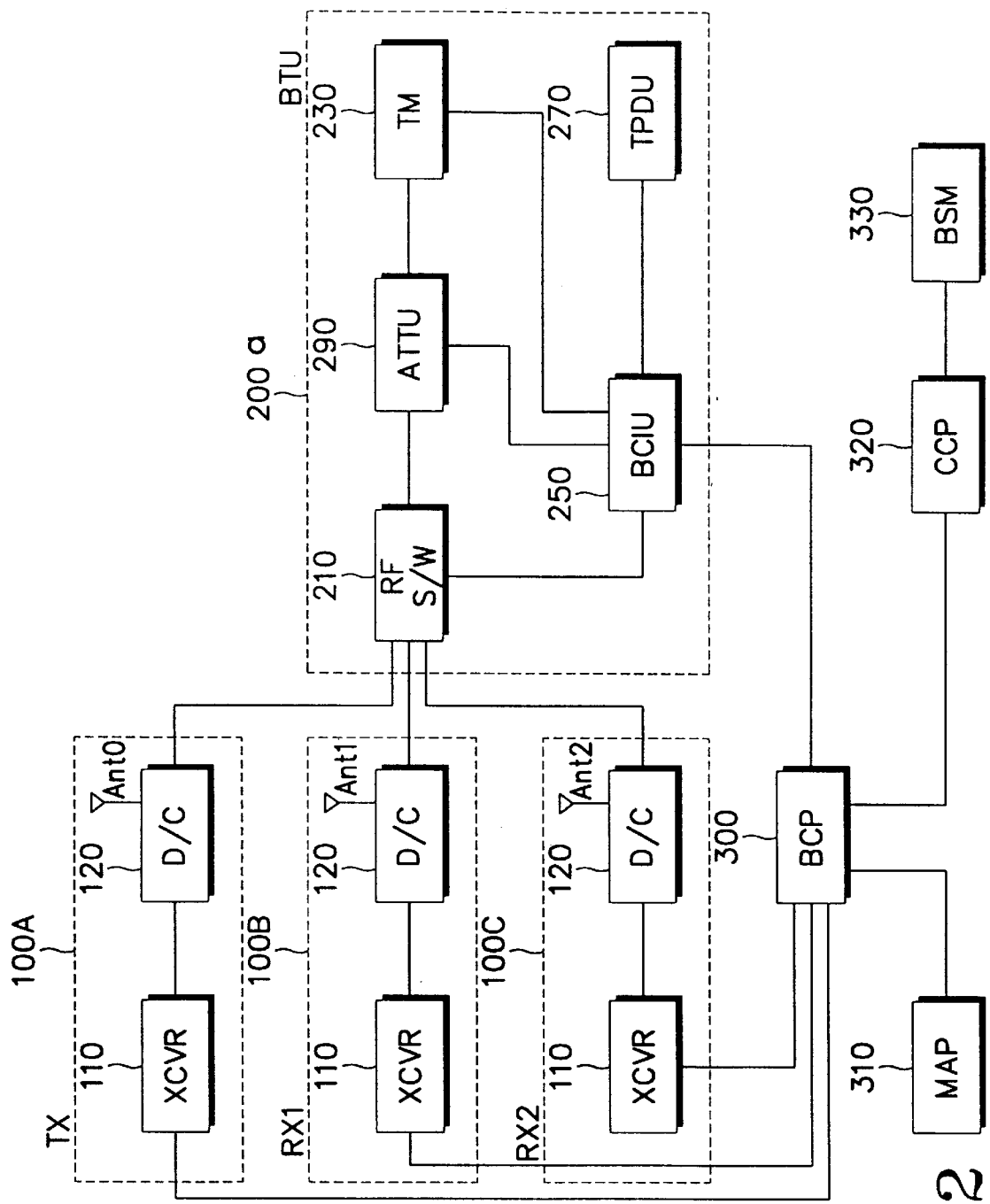

FIGS. 1 and 2 are block diagrams showing the construction of a base station of the CDMA communications system wherein a standing wave ratio is measured according to the present invention.

With reference to FIGS. 1 and 2, the base station according to the present invention includes one transmission terminal (TX) 100A, and two reception terminals (RX1 and RX2) 100B and 100C in accordance with diversity of structure. That is, it can be seen that the method for measuring the VSWR according to the present invention is described by taking the case of a base station installed at an omni-cell as an example. However, it is noted that the method for measuring the VSWR according to the present invention is equally performed when a sector cell is used to divide the base station into an α cell, β cell, and γ cell.

In the illustration of FIGS. 1 and 2, the transmission terminal 100A and the reception terminals 100B and 100C each include a transceiver (XCVR) 110, a directional coupler (D/C) 120, and antennas (Ant0, Ant1, and Ant2). The transceiver 110 is controlled by being connected commonly to a BCP (base station transceiver subsystem control processor) as a processor for controlling the base station system. In addition, MAP 310 (maintenance administration personal computer) 31 and CCP (call control processor) 320 are also connected to the BCP 300. The MAP 310 is a personal computer for testing, maintaining, administering, and operating the base station as the base station local, and the CCP 320 is a processor for performing call processing while being at the BSC (base station controller) 300 as an upper processor of the BCP 300. In addition, the base station test unit (BTU) 200, as a characteristic unit according to the present invention, is connected to the BCP 300, which performs the operation of measuring the VSWR in accordance with the present invention.

The BTU 200 has at least one transmission path/reception path switch unit (radio frequency switch unit : RF S/W) 210, a test terminal (TM: terminal mobile station) 230, a control circuit unit (BCIU: BTU control processor) 250, and a transmission power detection unit (TPDU: Tx power detection unit) 270. In this case, as shown in FIG. 1, the BTU 200 is composed of only units as stated hereinbefore. However, as shown in FIG. 2, the BTU 200a includes an attenuation unit (ATTU) 290 in addition to the above units. This means that the method for measuring the VSWR according to the present invention can be performed by using the attenuation unit 290, on the one hand, or the method can be performed with no usage of the attenuation unit 290, on the other hand. The detailed description of the components described above will be given in the following explanation of FIG. 3. A BSM (base station manager) 330 performs testing, operation, maintenance and administration for the base station and can be embodied as the work station computer.

Figure 3:
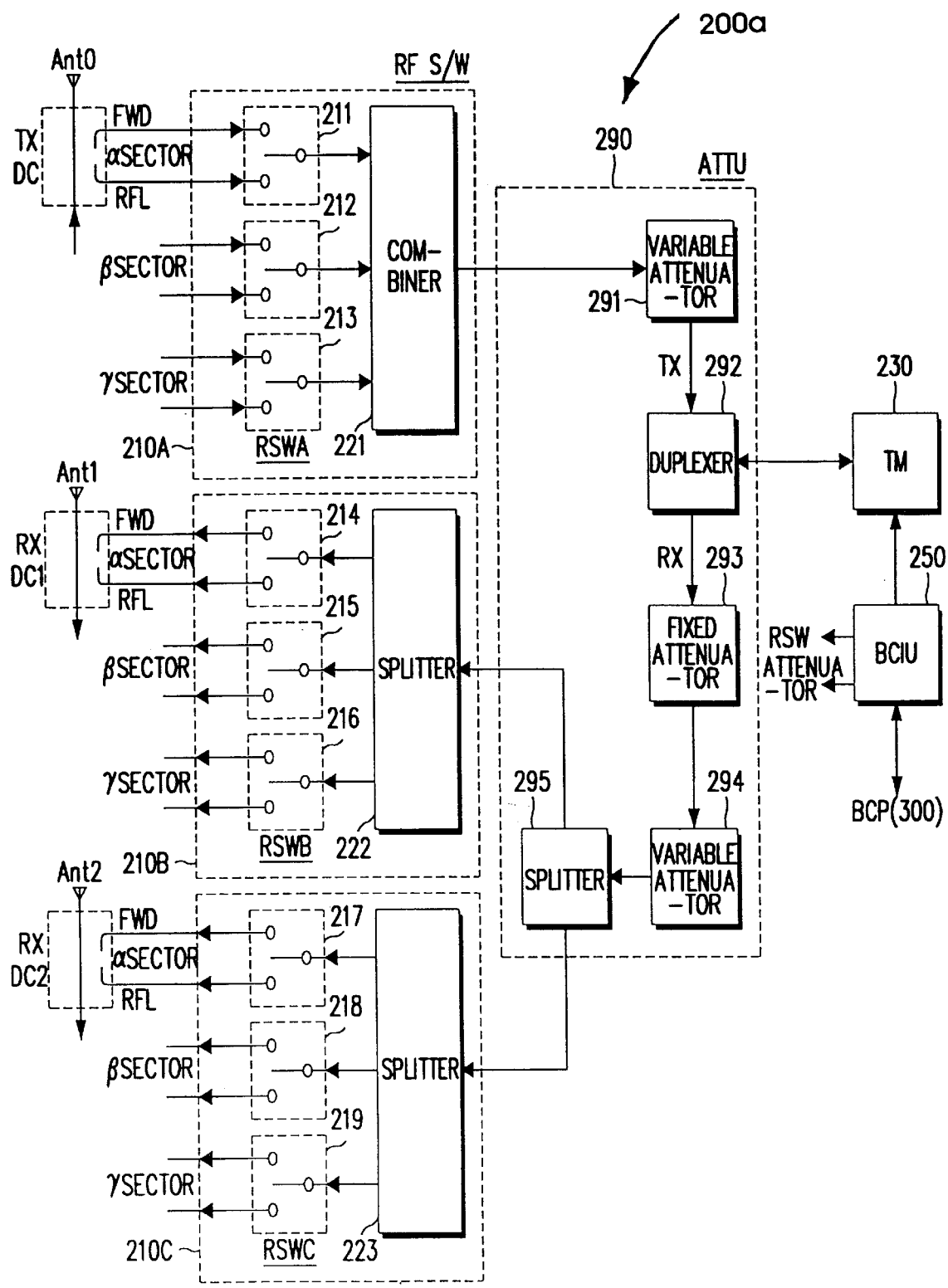
FIG. 3 is a detailed block diagram showing the construction of a base station test unit for testing the base station as illustrated in FIGS. 1 and 2.

FIG. 3 is a detailed block diagram showing the construction of a base station test unit for testing the base station as illustrated in FIGS. 1 and 2. The base station test unit 200a of FIG. 3 includes the attenuation unit 290. It is noted that the base station test unit was disclosed in a Korean Patent Application No. 94-30254 filed on Nov. 17, 1994, entitled "Cellular Base Station Testing Device" and assigned to the assignee (Samsung Electronics. Ltd.) of the present invention.

Referring to FIG. 3, the transmission path switch unit 210A is switched in response to the input of a transmission path switch control signal from the BCIU 250, selects a signal from a forward combining terminal (FWD) or a reflect combining terminal (RFL) of a transmission directional coupler (TX DC), and transmits the selected signal in the direction of the internal BTU 200. The reception path switch units 210B and 210C are switched in response to the input of first and second reception path switch control signals and transmit the inputted signals to directional couplers RX DC1 and 2. At this moment, each of the path switch units has the path switching construction corresponding to each sector (α sector, β sector, and γ sector) in the case where the base station is installed at the sector-cell. Namely, when the base station is installed at the sector-cell, each of switches (RSWA) 211 to 213 of the transmission path switch unit 210A is connected between the directional couplers of α sector, β sector, and γ sector, respectively, and a combiner 221. In contrast, each of switches (RSWB) 214 to 216 of the first reception path switch unit 210B is connected between a splitter 222 and the directional couplers of α sector, β sector, and γ sector, respectively, and each of switches (RSWC) 217 to 219 of the second reception path switch unit 210C is connected between a splitter 223 and the directional couplers of α sector, β sector, and γ sector, respectively. The splitters 222 and 223 can be replaced with a 4-way splitter.

The attenuation unit 290 comprises: a variable attenuator 291 for attenuating the gain of the transmission signal of the radio unit of the base station received from the transmission path switch unit 210A in response to a transmission attenuation control signal received from the BCIU 250, and for outputting the attenuated gain; a fixed attenuator 293 for fixedly attenuating the gain of a received radio frequency (RF) signal by a preset gain, for outputting the attenuated gain, and for facilitating the level connection of the radio signal; a variable attenuator 294 for attenuating the output of the fixed attenuator 293 in response to a reception attenuation control signal from the BCIU 250, and for outputting the attenuated output; a duplexer 292 connected between the variable attenuator 291, the fixed attenuator 293 and a text terminal 230 for separating a radio signal of the transmission path and a radio signal of the reception path, and for transceiving the separated signal to the test terminal 230; and a splitter 295 for splitting the signal from the output terminal of the variable attenuator 294 and for outputting the split signals into first and second reception path switch units 210B and 210C, respectively. The above variable attenuators 291 and 294 have an overall attenuation range of 60 dB with a maximum 1 dB step, and the splitter can be used as 2-way splitter.

The control circuit unit (BCIU: BTU control processor) 250 is a component for controlling overall operation of the BTU 200, and outputs a transmission path switch control signal, first and second reception path switch control signals, transmission/reception attenuation control signals and a test control signal. The outputted control signals are applied to the transmission path switch unit 210A, the reception path switch units 220B and 220C, the variable attenuators 291 and 294, and the test terminal 230 so that the radio path for testing has a construction similar to the real propagation environment. Also, the BCIU 250 analyses the inputted data and outputs the data of the tested result to the upper processor(BCP) 300.

The test terminal (TM) 230 outputs the call for testing in response to the test control signal from the BCIU 250 (hereinafter, referred to as "test call"), and outputs the data corresponding to the received signal to the BCIU 250. The test terminal 230 performs the functions of testing, diagnosing and monitoring the base station in addition to the above-mentioned functions according to the present invention. A portable radio telephone (for example, a hand phone of SCH-100 manufactured by the Samsung Electronics Ltd.) is commonly used as the test terminal 230.

Figure 4:
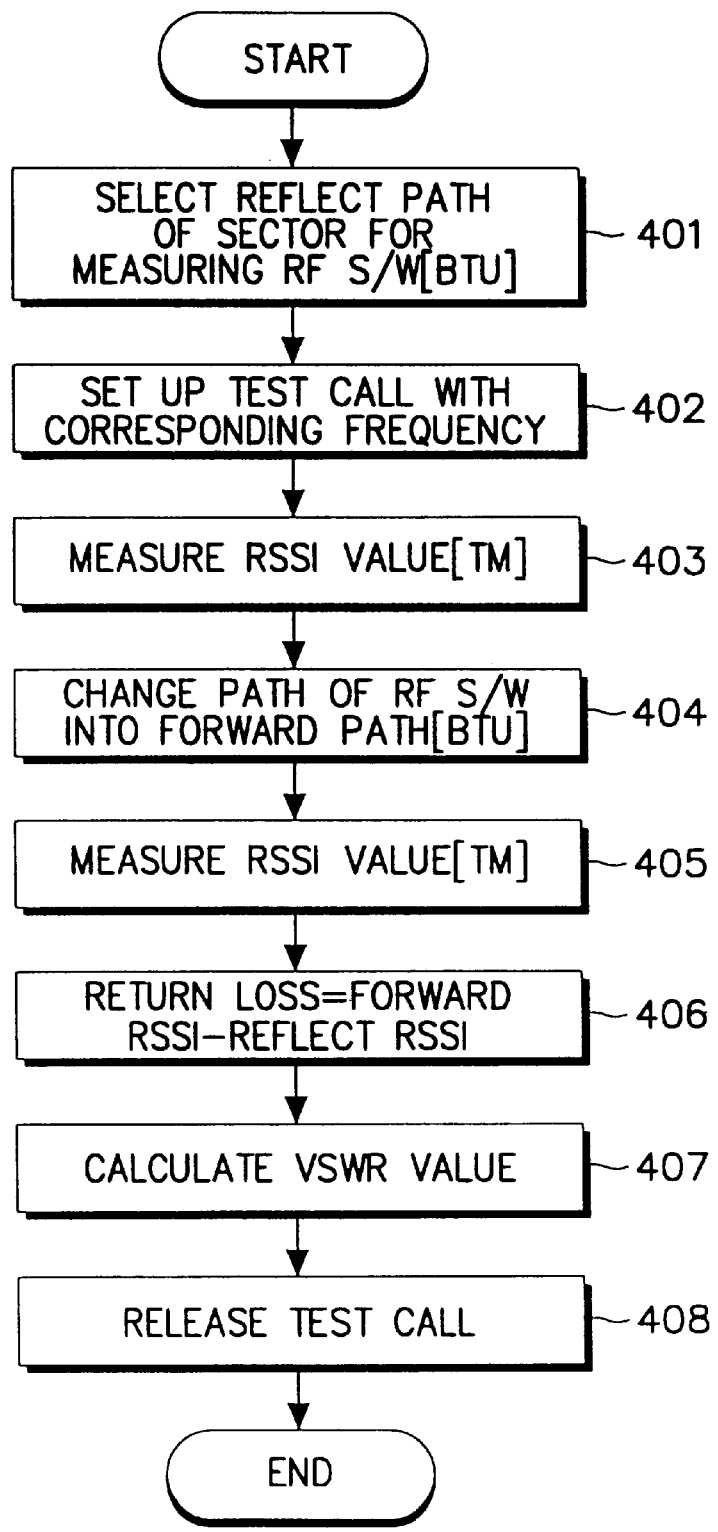
FIG. 4 is a flow chart showing processes for measuring a standing wave ratio of a transmission antenna by using a test call.
Figure 5:
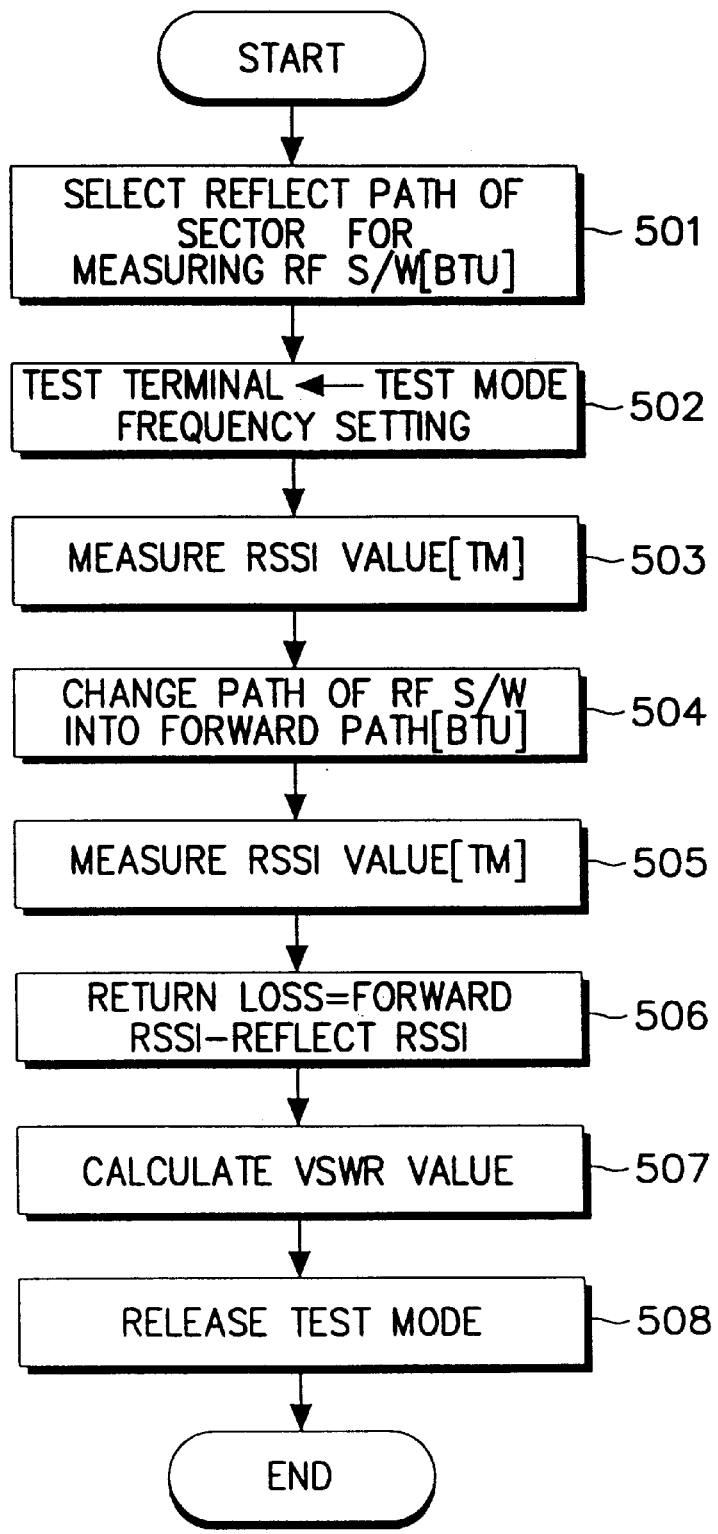
FIG. 5 is a flow chart showing processes for measuring a standing wave ratio of a transmission antenna by using a test mode of a test terminal.
Figure 6:
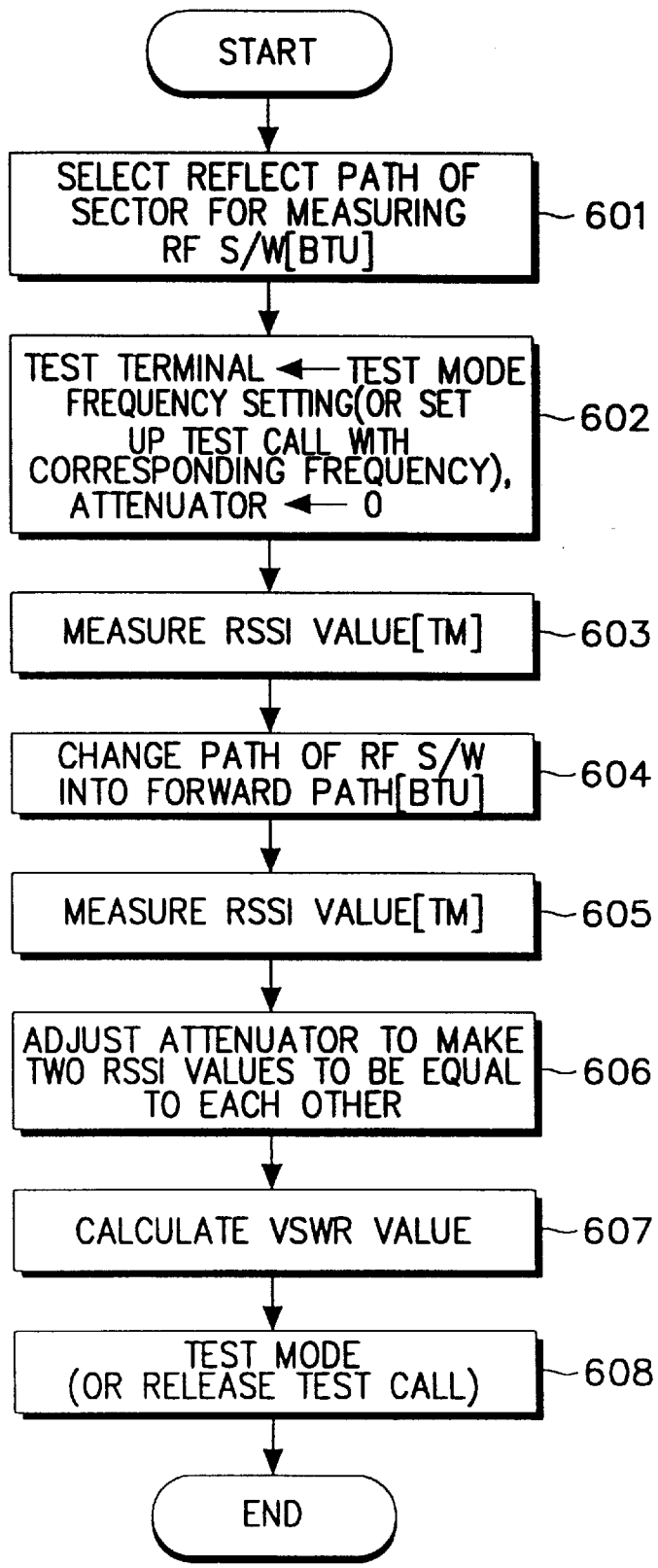
FIG. 6 is a flow chart showing processes for measuring a standing wave ratio of a transmission antenna by using a test call or an attenuation unit and a test mode of a test terminal.
Figure 7:
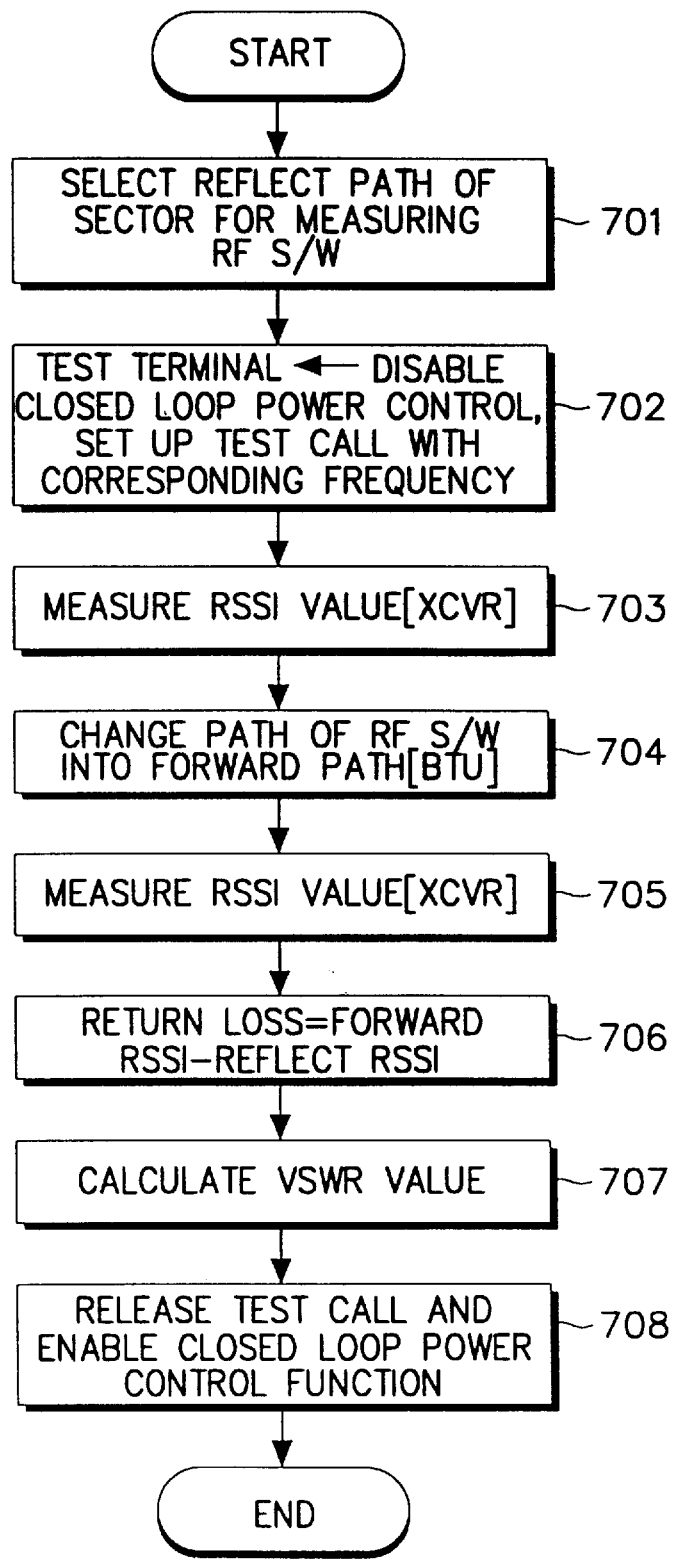
FIG. 7 is a flow chart showing processes for measuring a standing wave ratio of a reception antenna by using a test call.
Figure 8:
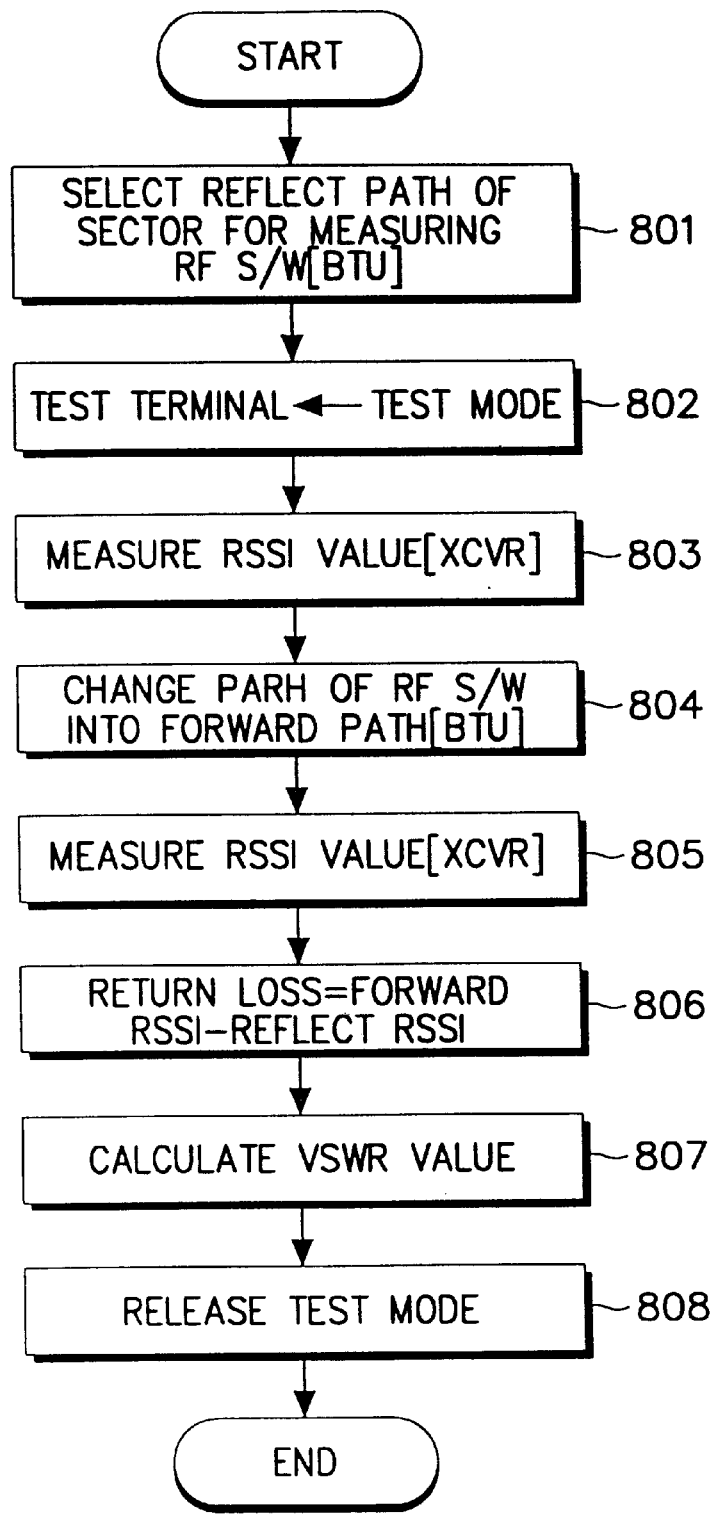
FIG. 8 is a flow chart showing processes for measuring a standing wave ratio of a reception antenna by using a test mode of a test terminal.
Figure 9:
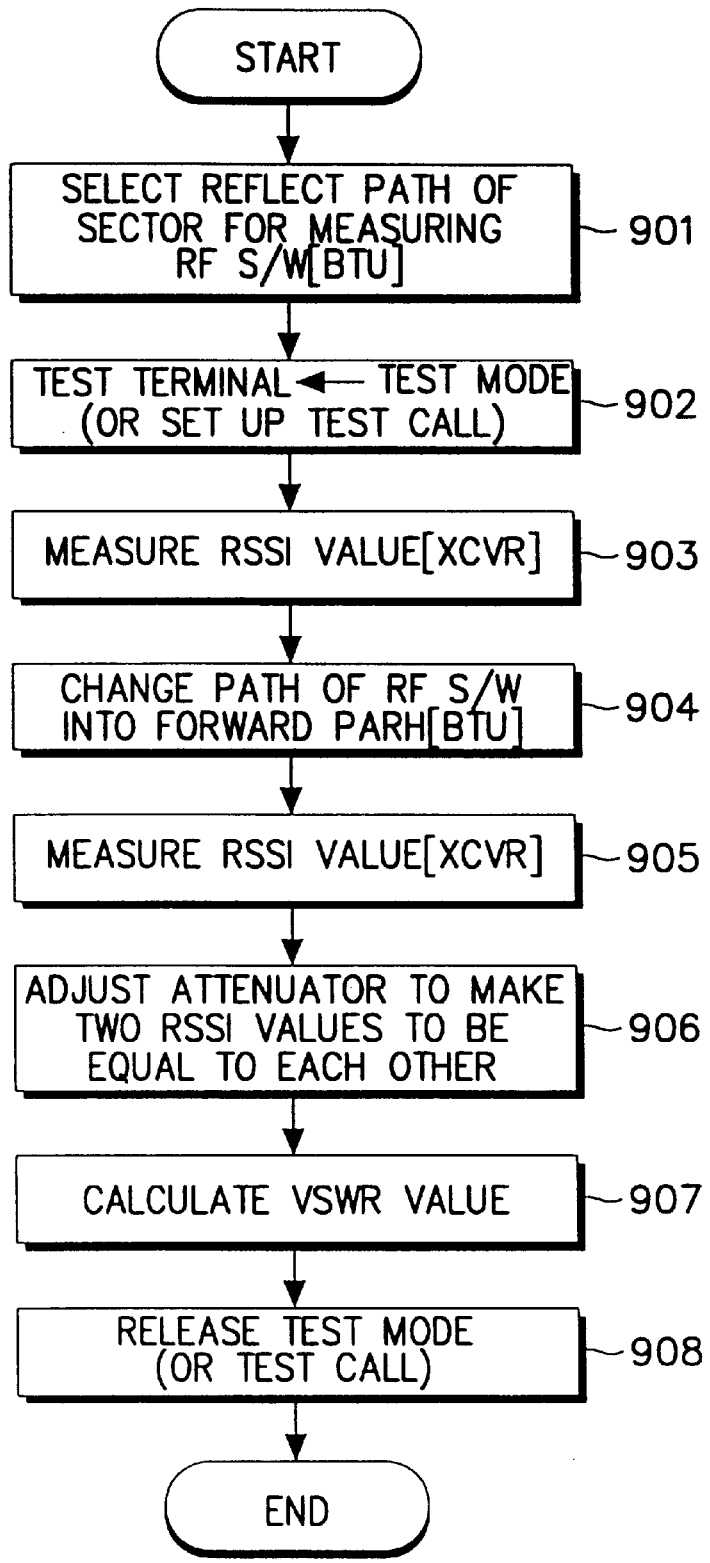
FIG. 9 is a flow chart showing processes for measuring a standing wave ratio of a reception antenna by using a test call or an attenuation unit and a test mode of a test terminal.

FIGS. 4 to 10 are flow charts showing processes for measuring the VSWR by connecting the base station test unit BTU 200 to the base station as shown in FIGS. 1 to 3. The method for measuring the VSWR according to the present invention is largely divided into a method for measuring the VSWR for the transmission antenna (as illustrated in FIGS. 4 to 6) and a method for measuring the VSWR for the reception antenna (as illustrated in FIGS. 7 to 9). Each of the methods can be performed by the arrangements of FIG. 1 or FIG. 2. In other words, the methods for measuring the VSWR for the transmission antenna and for the reception antenna will be explained in accordance with a method using the attenuation unit 290 and a method using no attenuation unit 290. Herein, the non-usage of the attenuation unit 290 means that the VSWR for the transmission antenna and for the reception antenna is measured by fixedly calibrating VSWR, and the usage of the attenuation unit 290 means that the VSWR for the transmission antenna and the reception antenna is measured by varying the VSWR value. Upon measuring the VSWR, the present invention utilizes the test terminal (TM) 230 included in the base station, and the test terminal 230 can be implemented with a test terminal having the capacity, by itself, of generating the test signal, or with a test terminal not having the capacity, by itself, of generating the test signal. When measuring the VSWR by using a test terminal having no capacity of generating the test signal, the test terminal 230 receives the input of the given test signal applied from the exterior and generates the test call for the measurement of the VSWR. To the contrary, when measuring the VSWR by using a test terminal having the capacity of generating the test signal, the test terminal 230 changes its mode into the test mode in response to the input of the requirement for measuring the VSWR from the exterior, and generates the test signal.

Firstly, referring to FIGS. 4 to 6, the method for measuring the VSWR for the transmission antenna will be described hereinafter.

FIG. 4 is a flow chart showing processes for measuring a standing wave ratio of the transmission antenna by using a test call, as performed by the arrangement of FIG. 1. That is, the flow chart as shown in FIG. 4 relates to the case where the VSWR for the transmission antenna is measured by means of a fixed RSSI value by the test terminal 230 without usage of the attenuation unit 290.

At step 401 of FIG. 4, the BCP 300 controls the BCIU 250 of the base station test unit (BTU) 200 and enables the transmission path switch control signal for selection of the given radio frequency (RF) signal to be generated so as to output the generated transmission path switch control signal to one of switch units 211 to 213 of the radio frequency switch unit (RF S/W) 201A. Thus, the reflect path of the sector for measurement in response to the generated transmission path switch control signal is selected. Upon the transmission path being selected as described hereinafter, the BCP 300 controls the test terminal (TM) 230 and sets up a test call with the corresponding frequency at step 402. Hereinafter, the BCP 300 measures the RSSI (received signal strength indicator) by using the test terminal 230 at step 403. From this, the RSSI of the reflect path for the transmission antenna is detected.

At step 404, the BCP 300 controls the BCIU 250 and generates the transmission path switch control signal so that the forward path of the sector for measurement by the generated transmission path switch control signal can be selected. When the transmission path as mentioned be for e is selected, the BCP 300 detects the RSSI (forward RSSI) for the forward path of the transmission antenna by using the test terminal 230 at step 405.

After the RSSIs for the reflect path and the forward path are detected as stated above, at step 406, the BCP 300 obtains the difference (forward RSSI—reflect RSSI) of two RSSIs generated at the above steps 403 and 405. In this case, the obtained value corresponds to the return loss. At step 407, the BCP 300 calculates the VSWR in conformity with the relationship as shown in following expression 1 with using the return loss valued obtained as indicated above. After obtaining the VSWR, the BCP 300 ends the operation of obtaining the VSWR for the transmission antenna by releasing the test call at step 408.

$$\text{Return Loss} = 20 \log |\Gamma| \qquad \text{[Expression 1]}$$

$$\Gamma = \frac{VSWR - 1}{VSWR + 1}$$

FIG. 5 is a flow chart showing processes for measuring a standing wave ratio of a transmission antenna by using a test mode of a test terminal, as performed by the arrangement of FIG. 1. That is, the flow chart as shown in FIG. 5 is the case where the VSWR for the transmission antenna is measured with a fixed frequency value by the test terminal 230 without usage of the attenuation unit 290. Here, the test terminal 230 has the capacity to generate the test call upon being set to the normal mode.

At step 501 of FIG. 5, the BCP 300 controls the BCIU 250 of the base station test unit (BTU) 200 and enables the transmission path switch control signal to select the given radio frequency (RF) signal to be generated so as to output the generated transmission path switch control signal to one of switch units 211 to 213 of the radio frequency switch unit (RF S/W) 201A. Thus, the reflect path of the sector is selected for measurement in response to the generated transmission path switch control signal. Upon the transmission path being selected, as described hereinafter, the BCP 300 changes the test terminal (TM) 230 into the test mode and sets the frequency to be tuned to the frequency for measurement at step 502. Then, the BCP 300 measures the RSSI (received signal strength indicator) by using the test terminal 230 at step 503. From this, the RSSI of the reflect path for the transmission antenna is detected.

At step 504, the BCP 300 controls the BCIU 250 and generates the transmission path switch control signal so that the forward path of the sector can be selected for measurement by the generated transmission path switch control signal. When the transmission path mentioned above is selected, the BCP 300 detects the RSSI (forward RSSI) for the forward path of the transmission antenna by using the test terminal 230 at step 505.

After the RSSIs for the reflect path and the forward path are detected as stated be for e, at step 506, the BCP 300 obtains the difference (forward RSSI—reflect RSSI) of the two RSSIs generated at the above steps 503 and 505. In this case, the obtained value corresponds to the return loss. At step 507, the BCP 300 calculates the VSWR in conformity with the relationship as shown in following expression 1 above by using the return loss value obtained as indicated above. After obtaining the VSWR, the BCP 300 ends the operation of obtaining the VSWR for the transmission antenna by releasing the test call at step 508.

FIG. 6 is a flow chart showing processes for measuring a standing wave ratio of a transmission antenna by using a test call or an attenuation unit and a test mode of a test terminal, as performed by the arrangement of FIG. 2. That is, the flow chart as shown in FIG. 6 is the case where the VSWR for the transmission antenna is measured with an unfixed frequency value by the test terminal 230, while determining the frequency value of the test terminal 230 by the attenuation unit 290.

At step 601 of FIG. 6, the BCP 300 controls the BCIU 250 of the base station test unit (BTU) 200 and enables the transmission path switch control signal for selection of the given radio frequency (RF) signal to be generated so as to output the generated transmission path switch control signal to one of switch units 211 to 213 of the radio frequency switch unit (RF S/W) 201A. Thus, the reflect path of the sector is selected for measurement in response to the generated transmission path switch control signal. Upon the transmission path being selected, as described hereinafter, the BCP 300 changes the test terminal (TM) 230 into the test mode, sets the frequency to be tuned to the frequency for measurement (or sets up the test call with the corresponding frequency), and sets the attenuation value of the variable attenuator 291 of the attenuation unit 290 to "0" at step 602. Hereinafter, at step 603, the BCP 300 measures the RSSI (received signal strength indicator) by using the test terminal 230. From this, the RSSI of the reflect path for the transmission antenna is detected.

At step 604, the BCP 300 controls the BCIU 250 and generates the transmission path switch control signal so that the forward path of the sector is selected for measurement by the generated transmission path switch control signal. When the transmission path as mentioned above is selected, the BCP 300 detects the RSSI (forward RSSI) for the forward path of the transmission antenna by using the test terminal 230 at step 605.

After the RSSIs for the reflect path and the forward path are detected as stated above, the BCP 300 controls the variable attenuator 291 of the attenuation unit 290 at step 606 so as to make the two RSSIs generated at steps 603 and 605 equal to each other. Namely, the BCP 300 generates the variable attenuation control signal and adjusts the difference of the two RSSIs (forward RSSI—reflect RSSI) to be zero. In this case, the adjusted value corresponds to the return loss. At step 607, the BCP 300 calculates the VSWR in conformity with the relationship as shown in above expression 1 by using the return loss value obtained as indicated above. After obtaining the VSWR, the BCP 300 ends the operation of obtaining the VSWR for the transmission antenna by releasing the test mode (or the test call) at step 608.

Next, referring to FIGS. 7 to 9, the method for measuring the VSWR for the reception antenna will be described hereinafter.

FIG. 7 is a flow chart showing processes for measuring a standing wave ratio of a reception antenna by using a test call, as performed by the arrangement of FIG. 1. That is, the flow chart as shown in FIG. 7 is the case where the VSWR for the reception antenna is measured with a fixed RSSI value by the transceiver (XCVR) 110 without usage of the attenuation unit 290.

At step 701 of FIG. 7, the BCP 300 controls the BCIU 250 of the base station test unit (BTU) 200 and enables the reception path switch control signal for selection of the given radio frequency (RF) signal to be generated so as to output the generated reception path switch control signal to one of switch units 214 to 219 of the radio frequency switch units (RF S/W) 201B and 201C. Thus, the reflect path of the sector is selected for measurement in response to the generated reception path switch control signal. Upon the transmission path being selected, as described hereinafter, the BCP 300, disables the closed loop power control of the test terminal (TM) 230, controls the test terminal (TM) 300 and sets up the test call with the corresponding frequency at step 702. Hereinafter, the BCP 300 measures the RSSI (received signal strength indicator) by using the transceiver (XCVR) 110 at step 703. From this, the RSSI of the reflect path for the reception antenna is detected.

At step 704, the BCP 300 controls the BCIU 250 and generates the reception path switch control signal so that the forward path of the sector for measurement can be selected by the generated reception path switch control signal. When the transmission path as mentioned above is selected, the BCP 300 detects the RSSI (forward RSSI) for the forward path of the reception antenna by using the XCVR 110 at step 705.

After the RSSIs for the reflect path and the forward path are detected as stated above, at step 706, the BCP 300 obtains the difference (forward RSSI—reflect RSSI) of the two RSSIs generated at the above steps 703 and 705. In this case, the obtained value corresponds to the return loss. At step 707, the BCP 300 calculates the VSWR in conformity with the relationship as shown in above expression 1 by using the return loss value obtained as indicated above. After obtaining the VSWR, the BCP 300 ends the operation of obtaining the VSWR for the reception antenna by releasing the test call and enabling the closed loop power control function of the test terminal 230 at step 708.

FIG. 8 is a flow chart showing processes for measuring a standing wave ratio of a reception antenna by using a test mode of a test terminal, as performed by the arrangement of FIG. 1. That is, the flow chart as shown in FIG. 8 is the case where the VSWR for the reception antenna is measured with the fixed RSSI value by the transceiver (XCVR) 110 without usage of the attenuation unit 290.

At step 801 of FIG. 8, the BCP 300 controls the BCIU 250 of the base station test unit (BTU) 200 and enables the reception path switch control signal for selection of the given radio frequency (RF) signal to be generated so as to output the generated reception path switch control signal to one of switch units 214 to 219 of the radio frequency switch units (RF S/W) 201B and 201C. Thus, the reflect path of the sector for measurement is selected in response to the generated reception path switch control signal. Upon the transmission path being selected, as described below, the BCP 300 sets the test terminal (TM) 230 to the test mode in order to generate the given output of the test terminal 230 at step 802, and measures the RSSI value by using the XVCR 110 at step 803. From this, the RSSI of the reflect path for the reception antenna is detected.

At step 804, the BCP 300 controls the BCIU 250 and generates the reception path switch control signal, so that the forward path of the sector for measurement can be selected by the generated reception path switch control signal. When the transmission path as mentioned above is selected, the BCP 300 detects the RSSI (forward RSSI) for the forward path of the reception antenna by using the XCVR 110 at step 805.

After the RSSIs for the reflect path and the forward path are detected as stated above, at step 806, the BCP 300 obtains the difference (forward RSSI—reflect RSSI) of the two RSSIs generated at the above steps 803 and 805. In this case, the obtained value corresponds to the return loss. At step 807, the BCP 300 calculates the VSWR in conformity with the relationship as shown in following expression 1 by using the return loss value obtained as indicated above. After obtaining the VSWR, the BCP 300 ends the operation of obtaining the VSWR for the reception antenna by releasing the test mode at step 808.

FIG. 9 is a flow chart showing processes for measuring a standing wave ratio of a reception antenna by using a test call or an attenuation unit and a test mode of a test terminal, as performed by the arrangement of FIG. 2. That is, the flow chart as shown in FIG. 9 is the case where the VSWR for the reception antenna is measured with the non-fixed RSSI value by the transceiver (XCVR) 110, while determining the RSSI value of the transceiver 110 by the attenuation unit 290.

At step 901 of FIG. 9, the BCP 300 controls the BCIU 250 of the base station test unit (BTU) 200 and enables the reception path switch control signal for selection of the given radio frequency (RF) signal to be generated so as to output the generated reception path switch control signal to one of switch units 214 to 219 of the radio frequency switch units (RF S/W) 201B and 201C. Thus, the reflect path of the sector is selected for measurement in response to the generated reception path switch control signal. Upon the transmission path being selected, as described hereinafter, the BCP 300 sets the test terminal (TM) 230 to the test mode (or sets up the test call) so as to generate the given output of the test terminal 230 at step 902, and measures the RSSI value by using the XCVR 110 at step 903. From this, the RSSI (reflect RSSI) of the reflect path for the reception antenna is detected.

At step 904, the BCP 300 controls the BCIU 250 and generates the reception path switch control signal, so that the forward path of the sector for measurement can be selected by the generated reception path switch control signal. When the transmission path as mentioned before is selected, the BCP 300 detects the RSSI (forward RSSI) for the forward path of the reception antenna by using the XCVR 110 at step 905.

After the RSSIs for the reflect path and the forward path are detected as stated above, at step 906, the BCP 300 controls the variable attenuator 291 of the attenuation unit 290 so as to make two RSSIs generated at the above steps 903 and 905 equal to each other. Namely, the BCP 300 generates the variable attenuation control signal and adjusts the difference of the two RSSIs (forward RSSI—reflect RSSI) to zero. In this case, the adjusted value corresponds to the return loss. At step 907, the BCP 300 calculates the VSWR in conformity with the relationship as shown in expression 1 by using the return loss value obtained as indicated is above. After obtaining the VSWR, the BCP 300 ends the operation of obtaining the VSWR for the reception antenna by releasing the test mode (or the test call) at step 908.

Figure 10:
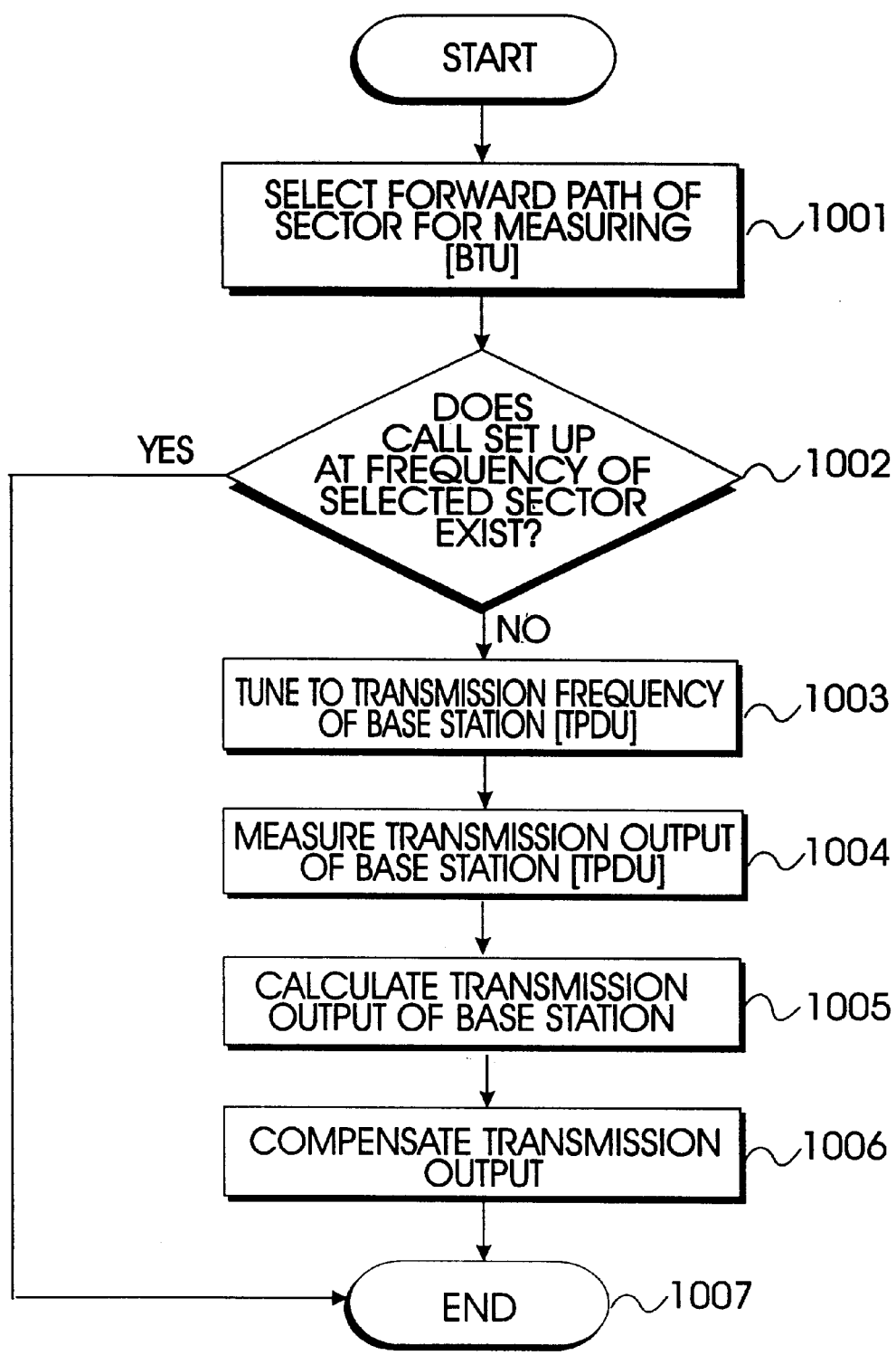
FIG. 10 is a flow chart showing processes for compensating transmission output according to the present invention.

FIG. 10 is a flow chart showing processes for compensating transmission output according to the present invention.

At step 1001 of FIG. 10, the BCP 300 controls the BTU 200 and selects the forward path of the sector for measurement by the radio frequency switch unit (RF S/W) 210 for selection of the radio signal. At step 1002, the BCP 300 checks whether or not the call set up at the frequency of the selected sector exists. When the call set up at the frequency of the selected sector exists, the BCP 300 does not compensate the transmission output and the operation ends at step 1007. When the call set up at the frequency of the selected sector does not exist, the BCP 300 tunes to the transmission frequency of the base station by using the TPDU 270 of the BTU 200 at step 1003, and measures the transmission output of the base station at step 1004. The BCP 300 then continues with compensation of the transmission output. That is, at step 1005, the BCP 300 calculates the transmission output of the current base station, and then compares the calculated value to the measured transmission output level so as to compensate the transmission output by the amount of the compared difference at step 1006.

As is apparent for m the foregoing, the present invention can obtain the VSWRs for the transmission antenna and the reception antenna by measuring the RSSI of the reflect signal and RSSI of the forward sinal, even if another test unit is not available, after generating the test signal by using the test terminal included in the base station. When using the VSWR value obtained as described above, it is advantageous that existence/nonexistence of the abnormal state of the base station and damage to the base station can be exactly monitored and diagnosed.

While there has been illustrated and described what are considered to be preferred embodiments of the present invention, it will be understood be those skilled in the art that various changes and modifications may be mode, and equivalents may be substituted for elements thereof without departing from the true scope of the present invention. In addition, many modifications may be made to adapt a particular situation to the teaching of the present invention without departing from the central scope thereof. There for e, it is intended that the present invention not be limited to the particular embodiments disclosed as the best modes contemplated for carrying out the present invention, but that the present invention includes all embodiments falling within the scope of the appended claims.

What is claimed is:

1. A method for measuring a standing wave ratio for an antenna in a base station of a mobile communications system which includes a test terminal and at least one antenna, the method comprising the steps of:

(a) generating a test signal by using said test terminal and transmitting said generated test signal to said antenna;

(b) when said test signal is transmitted to said antenna, measuring the strength of a forward signal and a reflect signal for said antenna; and (c) obtaining a difference between the strength of said forward signal and the strength of said reflect signal, and calculating the standing wave ratio for said antenna by using said obtained difference;

wherein said test terminal has a closed loop power control function which is disabled upon measurement of the standing wave ratio for said antenna.

2. The method as recited in claim 1, wherein step (a) comprises said test terminal assuming a test mode in response to a requirement for measurement of the standing wave ratio for said antenna.

3. The method as recited in claim 1, wherein said antenna comprises a transmission antenna.

4. The method as recited in claim 1, wherein said antenna comprises a reception antenna.

5. The method as recited in claim 4, wherein said mobile communications system includes a transceiver.

6. The method as recited in claim 1, wherein step (a) comprises said test terminal generating a test call as said test signal in response to a requirement for measurement of the standing wave ratio for said antenna.

7. A method for measuring a standing wave ratio for a transmission antenna in a base station of a mobile communications system which includes a test terminal, at least one transmission antenna and a variable attenuator, the method comprising the steps of:

(a) generating a test signal by using said test terminal and transmitting said generated test signal to said transmission antenna;

(b) when said test signal is transmitted to said transmission antenna, measuring the strength of a forward signal and a reflect signal for said transmission antenna;

(c) adjusting said variable attenuator to make the strength of said forward signal equal to the strength of said reflect signal; and (d) calculating the standing wave ratio for said transmission antenna by using the strength of said adjusted signal;

wherein said test terminal has a closed loop power control function which is disabled upon measurement of the standing wave ratio for said transmission antenna.

8. The method as recited in claim 7, wherein step (a) comprises said test terminal generating a test call as said test signal in response to a requirement for measurement of the standing wave ratio for said transmission antenna.

9. The method as recited in claim 7, wherein step (a) comprises said test terminal assuming a test mode in response to a requirement for measurement of the standing wave ratio for said transmission antenna.

10. A method for measuring a standing wave ratio for an antenna in a base station of a mobile communications system which includes a test terminal and at least one antenna, the method comprising the steps of:

(a) generating a test signal by using said test terminal and transmitting said generated test signal to said antenna;

(b) when said test signal is transmitted to said antenna, measuring the strength of a forward signal and a reflect signal for said antenna; and (c) obtaining a difference between the strength of said forward signal and the strength of said reflect signal and calculating the standing wave ratio for said antenna by using said obtained difference therebetween;

wherein step (a) comprises said test terminal assuming a test mode in response to a requirement for measurement of the standing wave ratio for said antenna, and said test signal has a given power strength upon measurement of the standing wave ratio for said antenna; and wherein said test terminal has a closed loop function which is disabled upon measurement of the standing wave ratio for said antenna.

11. The method as recited in claim 10, wherein step (a) comprises said test terminal generating a test call as said test signal in response to a requirement for measurement of the standing wave ratio for said antenna.

12. The method as recited in claim 10, wherein said antenna comprises a transmission antenna.

13. The method as recited in claim 10, wherein said antenna comprises a reception antenna.

14. The method as recited in claim 13, wherein said mobile communications system includes a transceiver.

15. A method for measuring a standing wave ratio for a reception antenna in a base station of a mobile communications system which includes a test terminal, at least one reception antenna, a transceiver and a variable attenuator, the method comprising the steps of:

(a) generating a test signal by using said test terminal and transmitting said generated test signal to said reception antenna;

(b) when said test signal is transmitted to said reception antenna, measuring the strength of a forward signal and a reflect signal for said reception antenna;

(c) adjusting said variable attenuator to make the strength of said forward signal equal to the strength of said reflect signal; and (d) calculating the standing wave ratio for said reception antenna by using the strength of said adjusted signal;

wherein step (a) comprises said test terminal assuming a test mode in response to a requirement for measurement of the standing wave ratio for said reception antenna, and wherein said test signal has a given power strength upon measurement of the standing wave ratio for said reception antenna; and wherein said test terminal has a closed loop function which is disabled upon measurement of the standing wave ratio for said reception antenna.

16. The method as recited in claim 15, wherein step (a) comprises said test terminal generating a test call as said test signal in response to a requirement for measurement of the standing wave ratio for said reception antenna.

17. A system for measuring a standing wave ratio for an antenna in a base station of a mobile communications system which includes at least one antenna, comprising:

test terminal means for generating a test signal and transmitting said generated test signal to said antenna;

measuring means responsive to transmission of said test signal for measuring the strength of a forward signal and a reflect signal for said antenna; and calculating means for calculating a difference between the strength of said forward signal and the strength of said reflect signal and for obtaining the standing wave ratio for said antenna by using said calculated difference;

wherein said test terminal has a closed loop power control function which is disabled upon measurement of the standing wave ratio for said antenna.

18. The system as recited in claim 17, wherein said test terminal assumes a test mode in response to a requirement for measurement of the standing wave ratio for said antenna.

19. The system as recited in claim 17, wherein said mobile communications system includes a transceiver.

20. The system as recited in claim 17, wherein said antenna comprises a transmission antenna.

21. The system as recited in claim 17, wherein said antenna comprises a reception antenna.

22. The system as recited in claim 21, wherein said mobile communications system includes a transceiver.

23. The system as recited in claim 17, wherein said test terminal generates a test call as said test signal in response to a requirement for measurement of the standing wave ratio for said antenna.

24. A system for measuring a standing wave ratio for an antenna in a base station of a mobile communications system which includes at least one antenna, comprising:

test terminal means for generating a test signal and transmitting said generated test signal to said antenna;

measuring means responsive to transmission of said test signal for measuring the strength of a forward signal and a reflect signal for said antenna;

attenuator means for adjusting the strength of at least one of said forward signal and said reflect signal to make them equal to each other; and calculating means for calculating the standing wave ratio for said antenna by using the strength of said adjusted signal;

wherein said test terminal means has a closed loop power control function which is disabled upon measurement of the standing wave ratio for said antenna.

25. The system as recited in claim 24, wherein said test terminal generates a test call as said test signal in response to a requirement for measurement of the standing wave ratio for said antenna.

26. The system as recited in claim 24, wherein said test terminal assumes a test mode in response to a requirement for measurement of the standing wave ratio for said antenna.

27. A system as recited in claim 24, wherein said mobile communications system includes a transceiver.

28. The system as recited in claim 24, wherein said antenna comprises a transmission antenna.

29. The system as recited in claim 24, wherein said antenna comprises a reception antenna.

30. The system as recited in claim 29, wherein said mobile communications system includes a transceiver.

* * * * *